(12) United States Patent
Lee

(10) Patent No.: US 10,831,406 B2
(45) Date of Patent: Nov. 10, 2020

(54) MEMORY CONTROLLER, MEMORY SYSTEM HAVING THE SAME, AND METHOD OF OPERATING THE SAME

(71) Applicant: SK hynix Inc., Gyeonggi-do (KR)

(72) Inventor: Hyun Woo Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 36 days.

(21) Appl. No.: 16/184,328

(22) Filed: Nov. 8, 2018

(65) Prior Publication Data

US 2019/0294372 A1 Sep. 26, 2019

(30) Foreign Application Priority Data

Mar. 21, 2018 (KR) ........................ 10-2018-0032856

(51) Int. Cl.
*G06F 3/06* (2006.01)
*G11C 29/38* (2006.01)
*G11C 29/14* (2006.01)
*G11C 16/04* (2006.01)

(52) U.S. Cl.
CPC .......... *G06F 3/0659* (2013.01); *G06F 3/0613* (2013.01); *G06F 3/0679* (2013.01); *G11C 29/14* (2013.01); *G11C 29/38* (2013.01); *G11C 16/0483* (2013.01)

(58) Field of Classification Search
CPC .... G06F 3/0611; G06F 3/0613; G06F 3/0614; G06F 3/0622; G06F 3/0659; G06F 3/0679; G11C 29/14; G11C 29/38
See application file for complete search history.

(56) References Cited

U.S. PATENT DOCUMENTS

| 2010/0191900 | A1* | 7/2010 | Park | G06F 12/0246 711/103 |
| 2012/0179883 | A1* | 7/2012 | Ma | G06F 13/1647 711/157 |
| 2015/0143068 | A1* | 5/2015 | Higgins | G06F 12/0238 711/166 |
| 2015/0177993 | A1* | 6/2015 | Ide | G06F 3/0611 711/103 |
| 2017/0123666 | A1 | 5/2017 | Sinclair et al. | |

* cited by examiner

*Primary Examiner* — Shelly A Chase
(74) *Attorney, Agent, or Firm* — IP & T Group LLP

(57) ABSTRACT

A memory controller includes an interleaving component configured to determine an access sequence of a plurality of memory units based on estimated execution times for the respective memory units to perform an operation, and a processor configured to access the memory units in the determined access sequence to perform the operation in an interleaved manner.

20 Claims, 13 Drawing Sheets

|  | ESTIMATED EXECUTION TIME | ACCESS SEQUENCE |
|---|---|---|
| MEMORY UNIT 1 | 13 | 1 |
| MEMORY UNIT 2 | 14 | 2 |
| MEMORY UNIT 3 | 16 | 3 |
| MEMORY UNIT 4 | 12 | 4 |

FIG. 12

|  | ESTIMATED EXECUTION TIME | ACCESS SEQUENCE |
|---|---|---|
| MEMORY UNIT 1 | 13 | 3 |
| MEMORY UNIT 2 | 14 | 2 |
| MEMORY UNIT 3 | 16 | 1 |
| MEMORY UNIT 4 | 12 | 4 |

MEMORY CONTROLLER, MEMORY SYSTEM HAVING THE SAME, AND METHOD OF OPERATING THE SAME

CROSS-REFERENCE TO RELATED APPLICATION

The present application claims priority under 35 U.S.C. § 119(a) to Korean patent application number 10-2018-0032856, filed on Mar. 21, 2018, which is incorporated herein by reference in its entirety.

BACKGROUND

1. Field of Invention

Various embodiments of the present disclosure relate to a memory controller and a memory system having the memory controller, and more particularly, to a memory controller that uses an interleaving scheme, a memory system having such memory controller, and a method of operating such memory controller.

2. Description of Related Art

A memory system may include a memory device and a memory controller.

The memory device may store data or output stored data under the control of the memory controller. For example, the memory device may be implemented as a volatile memory device in which stored data is lost when the supply of voltage is interrupted or as a nonvolatile memory device in which stored data is retained even when the supply of voltage is interrupted.

The memory controller may control data communication between a host and the memory device.

The host is capable of communicating with the memory system using an interface protocol, such as Peripheral Component Interconnect-Express (PCI-e or PCIe), Advanced Technology Attachment (ATA), Serial ATA (SATA), Parallel ATA (PATA) or Serial Attached SCSI (SAS). The host also may communicate with the memory system using any of various interfaces, such as Universal Serial Bus (USB), Multi-Media Card (MMC), Enhanced Small Disk Interface (ESDI), and Integrated Drive Electronics (IDE).

SUMMARY

Various embodiments of the present disclosure are directed to a memory controller that uses an interleaving scheme, a memory system having the memory controller, and a method of operating the memory controller.

An embodiment of the present disclosure provides for a memory controller. The memory controller includes an interleaving component configured to determine an access sequence of a plurality of memory units based on estimated execution times required by the respective memory units to perform an operation, and a central processing unit configured to access the memory units in the determined access sequence such that the operation is capable of being performed in an interleaved manner.

An embodiment of the present disclosure provides for a memory system. The memory system includes a plurality of memory units configured to perform an operation in an interleaved manner, and a memory controller configured to determine an access sequence of the memory units based on estimated execution times required by the respective memory units to perform the operation and to access the memory units in the determined access sequence.

An embodiment of the present disclosure provides for a method of operating a memory controller. The method includes acquiring information about estimated execution times required by a plurality of memory units to respectively perform an operation, determining an access sequence of the memory units based on the estimated execution times, and accessing the memory units in the determined access sequence such that the operation is capable of being performed in an interleaved manner.

An embodiment of the present disclosure provides for a memory system. The memory system includes a plurality of memory units configured to function as an interleaving group in an initial access sequence to perform an operation, and a memory controller suitable for reordering the access sequence of the memory units based on estimated execution times for the respective memory units to perform the operation, and accessing the memory units in the reordered access sequence.

BRIEF DESCRIPTION OF THE DRAWINGS

FIGS. 12 and 13 are diagrams illustrating a case where interleaving is controlled with consideration of estimated execution times.

DETAILED DESCRIPTION

Advantages and features of the present disclosure, and methods for achieving the same will be described in the context of various embodiments in detail together with the accompanying drawings.

However, elements and features of the present disclosure may be configured or arranged differently than disclosed herein. Thus, the present invention is not limited to the following embodiments. Rather, these embodiments are provided so that the present disclosure is to thorough and complete and fully conveys the disclosure to those skilled in the art. It is further noted that, throughout the specification, reference to "an embodiment," "another embodiment," or the like is not necessarily to only one embodiment, and different references to any such phrase are not necessarily to the same embodiment(s).

It is also noted that in this specification, "connected/coupled" refers to one component not only directly coupling another component but also indirectly coupling another component through one or more intermediate components. In the specification, when an element is referred to as "comprising" or "including" a component, it does not preclude the presence or addition of one or more other components but may further include such other component(s), unless the context clearly indicates otherwise.

Various embodiments of the present disclosure will be described with reference to the accompanying drawings.

Figure 1:
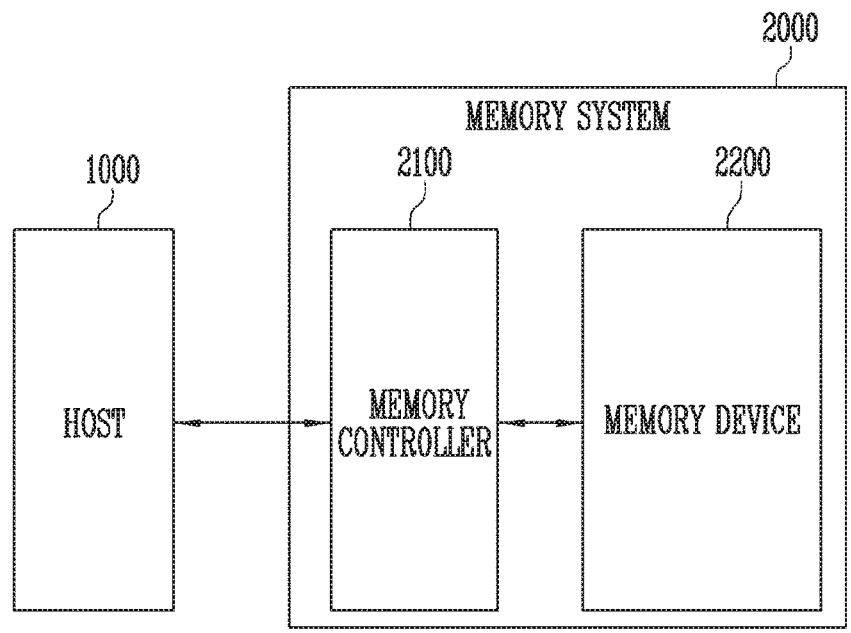
FIG. 1 is a diagram illustrating a memory system in accordance with an embodiment of the present disclosure.

FIG. 1 is a diagram illustrating a memory system 2000 in accordance with an embodiment of the present disclosure.

Referring to FIG. 1, the memory system 2000 may include a memory device 2200 which stores data, and a memory controller 2100 which controls the memory device 2200 under the control of a host 1000.

The host 1000 is capable of communicating with the memory system 2000 using an interface protocol, such as Peripheral Component Interconnect-Express (PCI-e or PCIe), Advanced Technology Attachment (ATA), Serial ATA (SATA), Parallel ATA (PATA) or Serial Attached SCSI (SAS). Interface protocols used between the host 1000 and the memory system 2000 are not limited to the above-described examples; alternatively, an interface protocol, such as Universal Serial Bus (USB), Multi-Media Card (MMC), Enhanced Small Disk Interface (ESDI), or Integrated Drive Electronics (IDE), may be used.

The memory controller 2100 may control the overall operation of the memory system 2000, and may control data exchange between the host 1000 and the memory device 2200. More specifically, the memory controller 2100 may convert (or translate) received information and store and output the converted information so that commands, addresses, and data may be exchanged between the host 1000 and the memory device 2200. For example, during a program operation, the memory controller 2100 transmits commands, addresses, and data to the memory device 2200.

The memory controller 2100 may control the memory device 2200 so that memory units included in the memory device 2200 perform an operation in an interleaved manner. That is, the memory controller 2100 may perform interleaving control on the memory units. The memory units may be elements that are capable of independently performing operations. For example, the memory units are dies or planes.

The memory controller 2100 may determine a sequence in which individual memory units are accessed (access sequence) to perform interleaving control on the memory units. The memory controller 2100 may determine the access sequence based on estimated execution times required by respective memory units to perform an operation. For example, the memory controller 2100 determines the access sequence such that a memory unit having a longer estimated execution time has an earlier or higher position in the access sequence (i.e., preceding turn) and a memory unit having a shorter estimated execution time has a later or lower position in the access sequence (i.e., subsequent turn).

Information about the estimated execution times may be received from the respective memory units or may be calculated by performing a test operation on the memory units.

The memory controller 2100 may perform interleaving control in the determined access sequence. That is, the memory controller 2100 may access the memory units in the determined access sequence when performing interleaving control on the memory units.

The memory device 2200 may perform an operation in response to a command received from the memory controller 2100. For example, the memory device 2200 receives a program command, a read command, and an erase command from the memory controller 2100. The memory units included in the memory device 2200 may be operated in an interleaved manner in response to the command received from the memory controller 2100.

Figure 2:
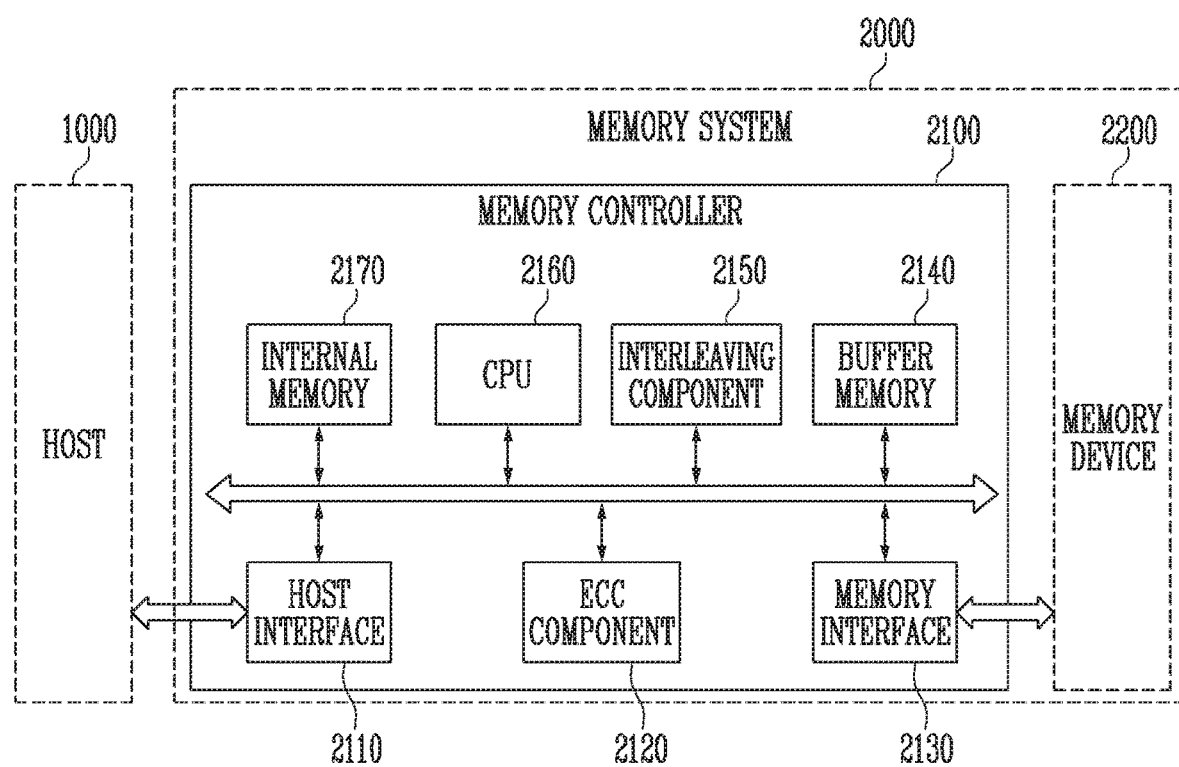
FIG. 2 is a diagram illustrating a memory controller in accordance with an embodiment of the present disclosure.

FIG. 2 is a diagram illustrating a memory controller in accordance with an embodiment of the present disclosure, for example, the memory controller 2100 illustrated in FIG. 1.

Referring to FIG. 2, the memory controller 2100 may include a host interface 2110, an error correcting code (ECC) component 2120, a memory interface 2130, a buffer memory 2140, an interleaving component 2150, a central processing unit (CPU) 2160, and an internal memory 2170. The host interface 2110, the ECC component 2120, the memory interface 2130, the buffer memory 2140, the interleaving component 2150, and the internal memory 2170 may be controlled by the CPU 2160. The CPU 2160 may be configured as one or more processors formed of appropriate circuitry to execute program instructions.

The host interface 2110 may perform data exchange with a host 1000 using a communication protocol.

The ECC component 2120 may detect an error and correct the detected error during a program operation or a read operation.

The memory interface 2130 may communicate with the memory device 2200 using a communication protocol.

The buffer memory 2140 may temporarily store data while the memory controller 2100 controls the memory device 2200. For example, data received from the host 1000 are temporarily stored in the buffer memory 2140 until the program operation is completed. During a read operation, data read from the memory device 2200 may also be temporarily stored in the buffer memory 2140. In an embodiment, the buffer memory 2140 may be disposed outside the memory controller 2100.

The interleaving component 2150 may acquire information about estimated execution times required by respective memory units, included in the memory device 2200, to perform an operation. The operation may be any one of a program operation, a read operation, and an erase operation. The interleaving component 2150 may acquire information about an estimated execution time of the operation that is the target of interleaving. When the operation that is the target of interleaving is a program operation, the interleaving component 2150 acquires information about the estimated execution time of the program operation. When the operation that is the target of interleaving is a read operation, the interleaving component 2150 acquires information about the estimated execution time of the read operation. When the operation that is the target of interleaving is an erase operation, the interleaving component 2150 acquires information about the estimated execution time of the erase operation. The acquisition of information about the estimated execution time may be performed either periodically or in response to a request from the CPU 2160.

In an embodiment, the interleaving component 2150 may receive information about the estimated execution times from the memory units included in the memory device 2200. For example, each of the dies included in the memory device 2200 stores information about an estimated execution time corresponding to the die, and the interleaving component 2150 receives information about estimated execution times corresponding to respective dies from the dies. Alternatively, each of the dies in the memory device 2200 may store information about estimated execution times corresponding to respective planes included in the corresponding die. In this case, the interleaving component 2150 may receive information about the estimated execution times corresponding to respective planes in the corresponding die from each die. In various embodiments, the memory units may store information about estimated execution times respectively corresponding to the program operation, the read operation, and the erase operation, and the interleaving component 2150 may receive information about the estimated execution times of respective operations. The interleaving component 2150 may store the received information about the estimated execution times.

In an embodiment, the interleaving component 2150 may calculate the estimated execution time of a memory unit by performing a test operation on that memory unit. The interleaving component 2150 may perform this calculation for any or all of the memory units. For example, the interleaving component 2150 controls the memory units so that each performs a test operation corresponding to any one of a program operation, a read operation, and an erase operation. The interleaving component 2150 may calculate the time that it takes for each of the memory units to perform the test operation to generate a test operation execution time for each of the memory units. The test operation execution times may be considered estimates. The interleaving component 2150 may store information about the calculated test operation execution times, that is, the estimated execution times. In various embodiments, the interleaving component 2150 may store information about estimated execution times respectively corresponding to the program operation, the read operation, and the erase operation. In an embodiment, the interleaving component 2150 may perform the test operation on one or more blocks in the corresponding memory unit, determine the time that it takes to perform the test operation, and consider such time to be the estimated execution time of the memory unit.

The interleaving component 2150 may determine the access sequence of individual memory units based on the acquired information about the estimated execution times. For example, the interleaving component 2150 determines the access sequence such that a memory unit having a longer estimated execution time has an earlier or higher sequential position in the access sequence (i.e., preceding turn) and a memory unit having a shorter estimated execution time has a later or lower sequential position in the access sequence (i.e., subsequent turn).

The CPU 2160 may perform various types of operations or generate commands and addresses so as to control the operation of the memory device 2200. For example, the CPU 2160 generates various commands required for a program operation, a read operation, an erase operation, a suspend operation, and copy-back operations.

The CPU 2160 may control the memory units so that the memory units perform an operation in an interleaved manner, and may access the memory units in the access sequence determined by the interleaving component 2150. For example, the CPU 2160 transmits first a command to a memory unit having the highest or first position in the sequence, and lastly transmits a command to a memory unit having the lowest or last position in the sequence.

The internal memory 2170 may be used as a storage which stores various types of information required for the operation of the memory controller 2100. The internal memory 2170 may include a map table. For example, the map table stores physical-to-logical address information and logical-to-physical address information.

Figure 3:
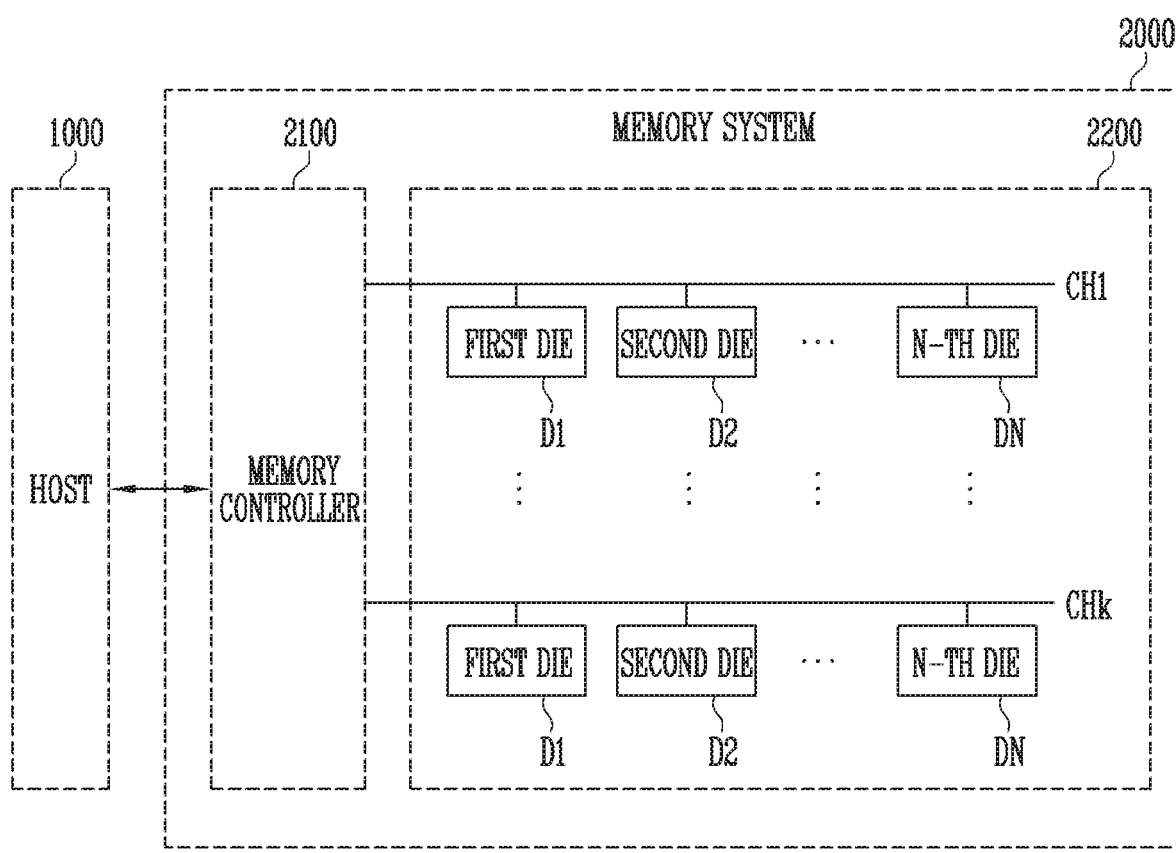
FIG. 3 is a diagram illustrating a memory device in accordance with an embodiment of the present disclosure.

FIG. 3 is a diagram illustrating a memory device in accordance with an embodiment of the present disclosure, for example, the memory device 2200 illustrated in FIG. 1.

The memory controller 2100 and the memory device 2200 illustrated in FIG. 3 may have the same configurations and perform the same operations as their respective counterparts described with reference to FIGS. 1 and 2.

In the embodiment described with reference to FIG. 3, description of components identical to those described above with reference to FIGS. 1 and 2 are omitted.

Referring to FIG. 3, the memory controller 2100 may be coupled to the memory device 2200 through a plurality of channels CH1 to CHk. The memory device 2200 may include a plurality of dies D1 to DN (where N is a positive integer). The plurality of dies D1 to DN may communicate with the memory controller 2100 through the plurality of channels CH1 to CHk. For example, a set of dies D1 to DN is coupled to each of the channels CH1 to CHk. The dies coupled to different channels may be operated independently of each other. For example, the die D1 coupled to the channel CH1 and the die D1 coupled to the channel CHk may be simultaneously operated. An interleaving scheme may be used between dies coupled to different channels or between dies coupled to the same channel.

When the interleaving scheme is used, the dies D1 to DN coupled to the same channel may be operated independently of each other. For example, when the interleaving scheme is used, the die D1 coupled to the channel CH1 and the die D2 coupled to the channel CH1 may be simultaneously operated.

Figure 4:
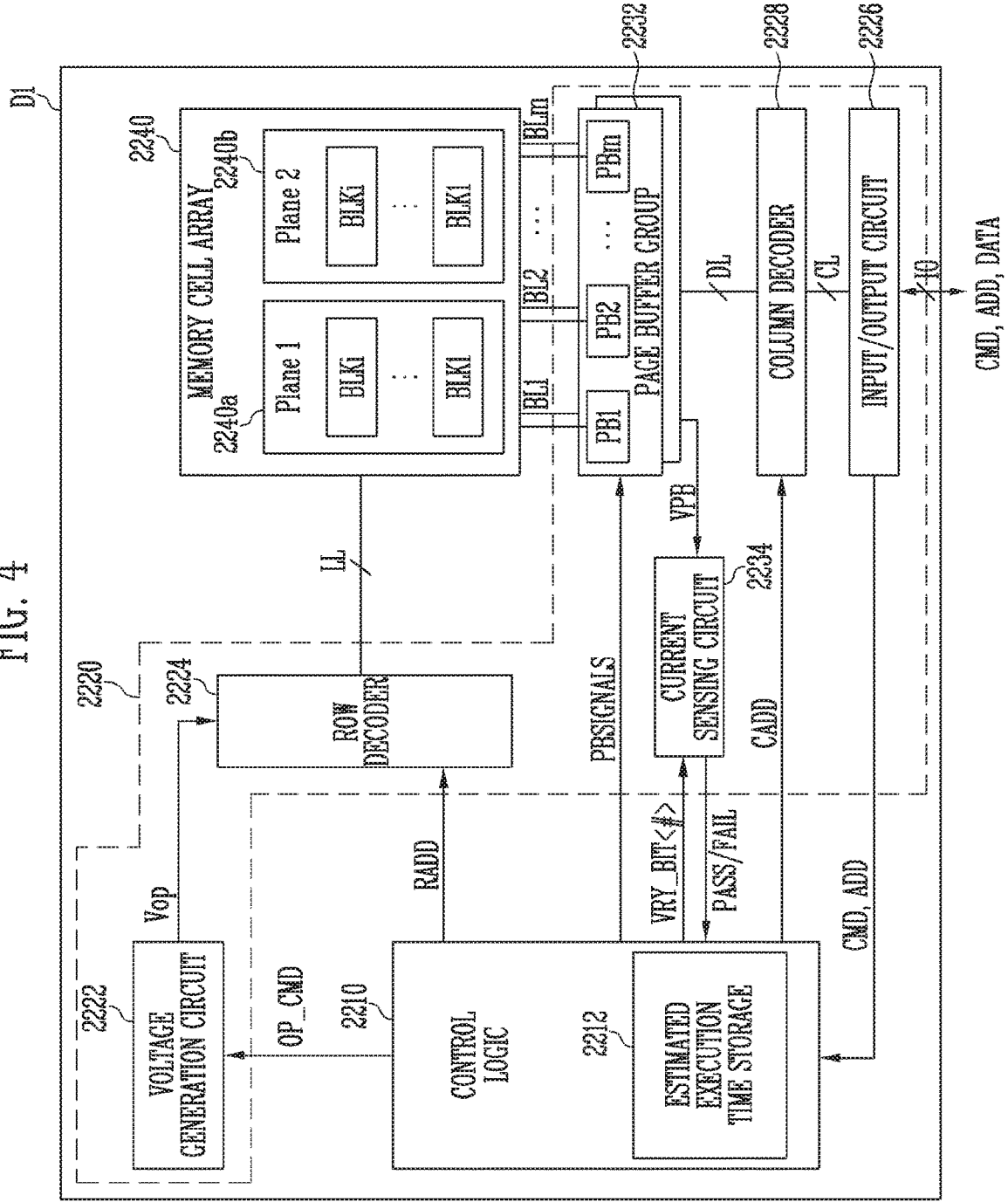
FIG. 4 is a diagram illustrating a die in accordance with an embodiment of the present disclosure.

FIG. 4 is a diagram illustrating a die in accordance with an embodiment of the present disclosure, for example, one of the dies D1 illustrated in FIG. 3. Since the dies illustrated in FIG. 3 may be configured the same, any one die, e.g., D1 of CH1, of the dies is described by way of example.

Referring to FIG. 4, the die D1 may include control logic 2210, a peripheral circuit 2220 and a memory cell array 2240. The memory cell array 2240 may include a plurality of planes, for example, plane 1 2240a and plane 2 2240b. Each of the planes may include a plurality of memory blocks BLK1 to BLKi. The peripheral circuit 2220 may include a voltage generation circuit 2222, a row decoder 2224, an input/output circuit 2226, a column decoder 2228, a page buffer group 2232, and a current sensing circuit 2234.

The control logic 2210 may control the peripheral circuit 2220 under the control of the memory controller 2100 illustrated in FIG. 2.

The control logic 2210 may control the peripheral circuit 2220 in response to a command CMD and an address ADD that are received from the memory controller 2100 through the input/output circuit 2226. For example, the control logic 2210 outputs an operation signal OP_CMD, a row address RADD, page buffer control signals PBSIGNALS, and an enable bit VRY_BIT<#> in response to the command CMD and the address ADD. The control logic 2210 may determine whether a verify operation has passed or failed in response to a pass or fail signal PASS or FAIL received from the current sensing circuit 2234.

The control logic 2210 may include an estimated execution time storage 2212. The estimated execution time storage 2212 may store information about estimated execution times required by respective memory units to perform an operation. In an embodiment, the estimated execution time storage 2212 may store information about estimated execution times corresponding to the die D1. In an embodiment, the estimated execution time storage 2212 may store information about estimated execution times corresponding to respective planes 2240a and 2240b in the die D1. The estimated execution time storage 2212 may store information about estimated execution times corresponding to respective operations. For example, the estimated execution time storage 2212 stores information about estimated execution times required by respective memory units to perform a program operation, store information about estimated execution times required by respective memory units to perform a read operation, or store information about estimated execution times required by respective memory units to perform an erase operation. The information about the estimated execution times may be stored through a test operation, which may be performed during manufacturing of the memory device 2200. For example, the test operation includes at least one of a test program operation, a test read operation, and a test erase operation.

The peripheral circuit 2220 may perform a program operation of storing data in the memory cell array 2240, a read operation of outputting data stored in the memory cell array 2240, and an erase operation of erasing data stored in the memory cell array 2240.

The voltage generation circuit 2222 may generate various operating voltages Vop that are used for the program, read, and erase operations in response to the operation signal OP_CMD received from the control logic 2210. For example, the voltage generation circuit 2222 transfers a program voltage, a verify voltage, a pass voltage, a compensation program voltage, a read voltage, an erase voltage, and a turn-on voltage to the row decoder 2224 through global lines.

The row decoder 2224 may transfer the operating voltages Vop to local lines LL that are coupled to a memory block selected from among memory blocks included in the memory cell array 2240 in response to the row address RADD received from the control logic 2210. The local lines LL may include local word lines, local drain select lines, and local source select lines. In addition, the local lines LL may include various lines, such as source lines, coupled to memory blocks.

The input/output circuit 2226 may transfer the command CMD and the address ADD, received from an external device, for example, the memory controller 2100 through input/output (JO) lines, to the control logic 2210, or may exchange data with the column decoder 2228.

The column decoder 2228 may transfer data between the input/output circuit 2226 and the page buffer group 2232 in response to a column address CADD received from the control logic 2210. For example, the column decoder 2228 exchanges data with page buffers PB1 to PBm through data lines DL or exchanges data with the input/output circuit 2226 through column lines CL.

The page buffer group 2232 may be coupled to bit lines BL1 to BLm coupled in common to the memory blocks BLK1 to BLKi. The page buffer group 2232 may include a plurality of page buffers PB1 to PBm coupled to the bit lines BL1 to BLm, respectively. For example, one page buffer is coupled to each bit line. The page buffers PB1 to PBm may be operated in response to the page buffer control signals PBSIGNALS received from the control logic 2210. During a program operation, the page buffers PB1 to PBm temporarily stores program data received from the memory controller 2100 through the input/output lines IO, the column lines CL and the data lines DL, and controls voltages to be applied to the bit lines BL1 to BLm based on the program data. During a read operation, the page buffers PB1 to PBm temporarily stores data received from the memory cell array 2240 through the bit lines BL1 to BLm or senses voltages or currents of the bit lines BL1 to BLm. One page buffer group 2232 may be arranged in each of planes 2240a and 2240b to correspond thereto.

During a read operation or a verify operation, the current sensing circuit 2234 may generate a reference current in response to the enable bit VRY_BIT<#> received from the control logic 2210. The current sensing circuit 2234 may compare a reference voltage, generated by the reference current, with a sensing voltage VPB, received from the page buffer group 2232, and then output a pass signal PASS or a fail signal FAIL.

The memory cell array 2240 may include the plurality of planes 2240a and 2240b. Although two planes 2240a and 2240b are illustrated in FIG. 4, the number of planes included in the die D1 is not limited thereto. Each of the plurality of planes 2240a and 2240b may include the plurality of memory blocks BLK1 to BLKi in which data is stored. In the memory blocks BLK1 to BLKi, user data and various types of information required for the operation of the memory device 2200 may be stored. The memory blocks BLK1 to BLKi may each be implemented as a two-dimensional (2D) structure or a three-dimensional (3D) structure, and may be equally configured.

Figure 5:
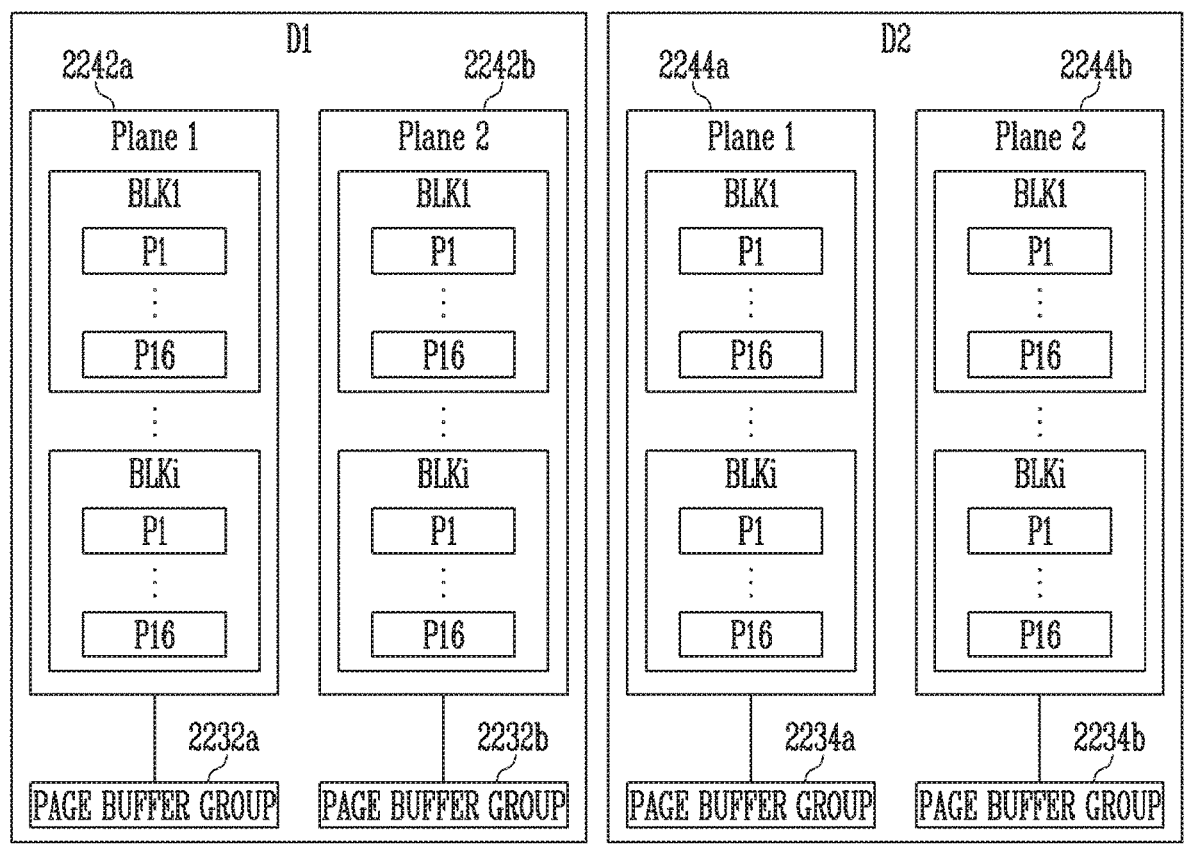
FIG. 5 is a diagram illustrating a memory cell array of a die in accordance with an embodiment of the present disclosure.

FIG. 5 is a diagram illustrating a memory cell array of dies in accordance with an embodiment of the present disclosure, for example, the dies D1 and D2 of any of the channels illustrated in FIG. 3.

Referring to FIG. 5, for clarity, only a first die D1 and a second die D2 are illustrated.

Each of the first and second dies D1 and D2 may include a plurality of planes. For example, the first die D1 includes first and second planes 2242a and 2242b, and the second die D2 includes first and second planes 2244a and 2244b. In FIG. 5, two planes are illustrated as being included in one die; however, the number of planes included in each die is not limited thereto.

Page buffer groups 2232a, 2232b, 2234a, and 2234b may be coupled to the first and second planes 2242a, 2242b, 2244a, and 2244b, respectively.

When an interleaving scheme is used, the first die D1 and the second die D2 may independently perform an operation in response to a command received from a memory controller (e.g., 2100 of FIG. 3) even if the first die D1 and the second die D2 are coupled to the same channel. That is, when the first die D1 and the second die D2 are controlled in an interleaved manner, the first die D1 and the second die D2 may simultaneously perform an operation that is the target of interleaving.

Similarly, when the interleaving scheme is used, the first and second planes 2242a, 2242b, 2244a, and 2244b may independently perform an operation. For example, the planes 2242a and 2242b in the first die D1 may be simultaneously operated, and the planes 2244a and 2244b in the second die D2 may be simultaneously operated. In another example, at least one of the first and second planes 2242a and 2242b in the first die D1 and at least one of the first and second planes 2244a and 2244b in the second die D2 may be simultaneously operated.

Figure 6:
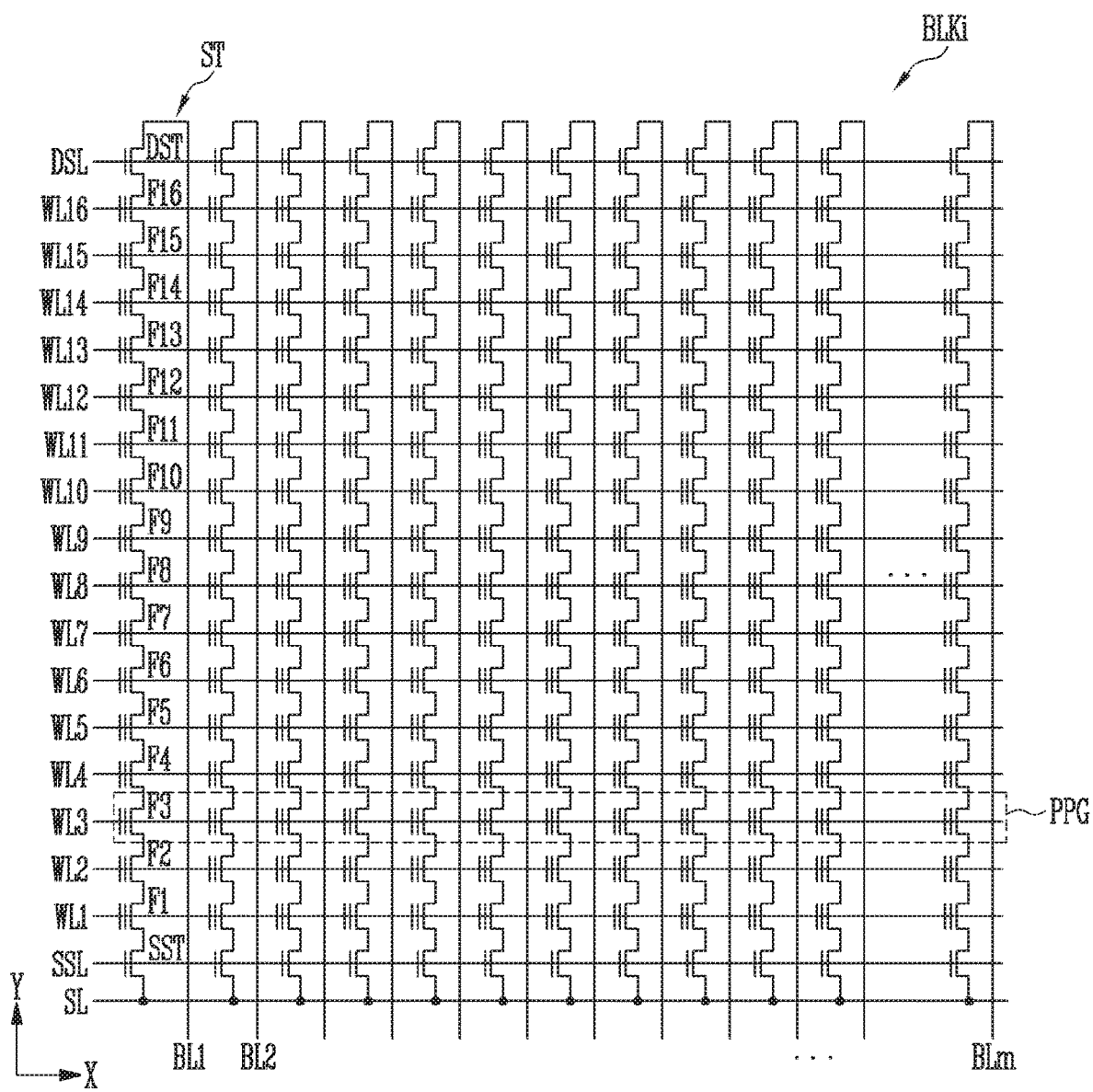
FIG. 6 is a diagram illustrating an exemplary memory block.

FIG. 6 is a diagram illustrating a memory block BLKi.

Referring to FIG. 6, a plurality of word lines WL1 to WL16 arranged in parallel between a first select line and a second select line may be coupled to the memory block BLKi. The first select line may be a source select line SSL, and the second select line may be a drain select line DSL. In detail, the memory block BLKi may include a plurality of strings ST coupled between bit lines BL1 to BLm and a source line SL. The bit lines BL1 to BLm may be coupled to the strings ST, respectively, and the source line SL may be coupled in common to the strings ST. The strings ST may be equally configured, and thus the string ST coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST in different strings ST may be coupled to the source select line SSL, gates of the drain select transistors DST in different strings ST may be coupled to the drain select line DSL, and gates of the memory cells F1 to F16 may be coupled to the plurality of word lines WL1 to WL16, respectively. A group of memory cells coupled to the same word line, among the memory cells in different strings ST, may be referred to as a "physical page: PPG". Therefore, the memory block BLKi may include a number of physical pages PPG identical to the number of word lines WL1 to WL16.

One memory cell may store one bit of data. This cell is called a single-level cell (SLC). Here, one physical page PPG may store data corresponding to one logical page LPG. The data corresponding to one logical page LPG may include a number of data bits identical to the number of cells included in one physical page PPG. Alternatively, one memory cell may store two or more bits of data. This cell is called a "multi-level cell (MLC)". Here, one physical page PPG may store data corresponding to two or more logical pages LPG.

A plurality of memory cells included in one physical page PPG may be simultaneously programmed. In other words, the memory device 2200 of FIGS. 1 to 3 may perform a program operation on each physical page PPG. The plurality of memory cells included in one memory block may be simultaneously erased. In other words, the memory device 2200 may perform an erase operation on each memory block BLKi. Here, the memory block BLKi may be referred to as an "erase unit block". For example, in order to update part of data stored in one memory block BLKi, the entire data stored in the memory block BLKi are read, and part of the read data to be updated is changed, after which the entire data are programmed to another memory block BLKi.

Figure 7:
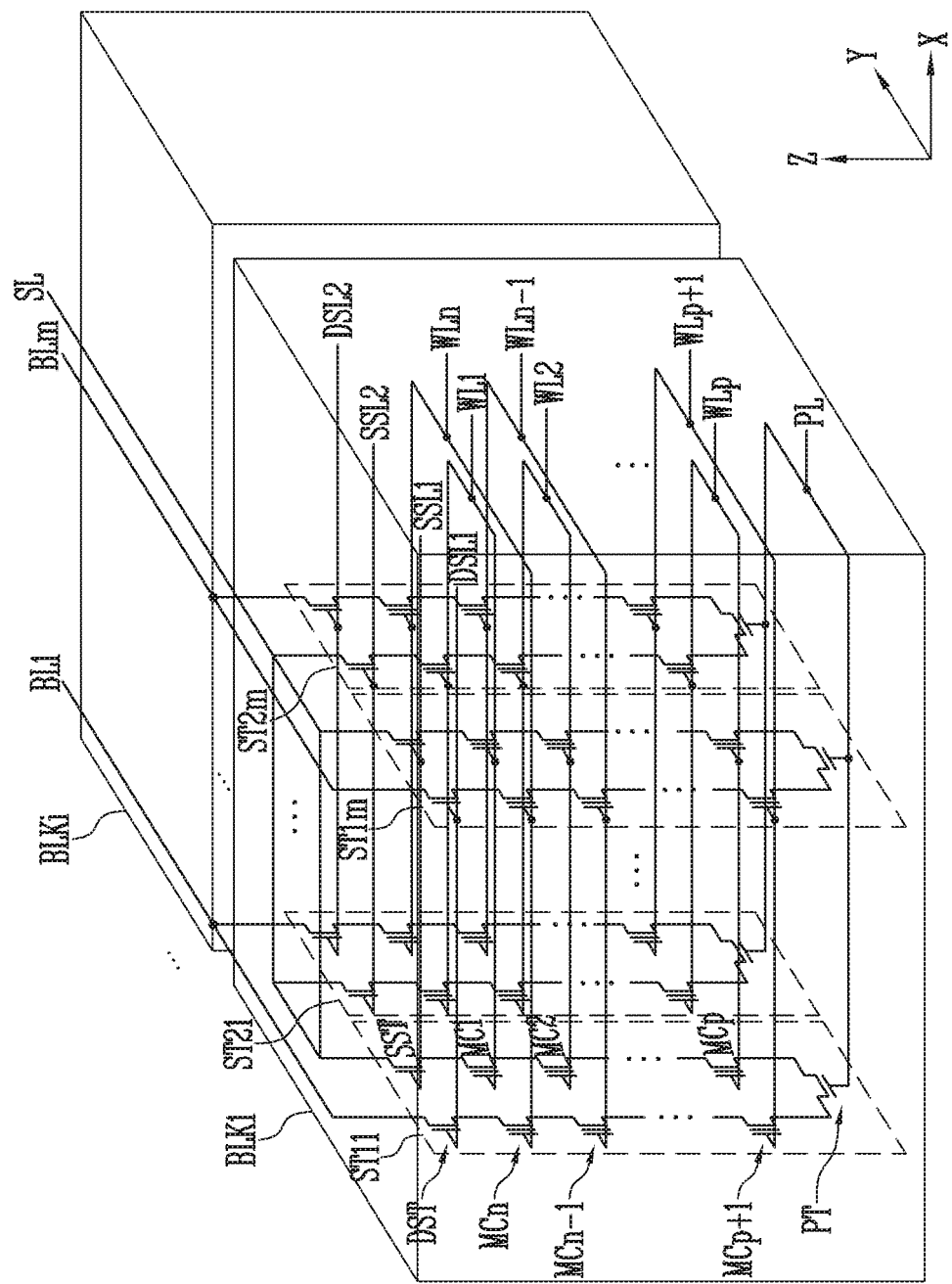
FIG. 7 is a diagram illustrating an example of a memory block having a three-dimensional (3D) structure.

FIG. 7 is a diagram illustrating an example of a memory block having a three-dimensional (3D) structure.

Referring to FIG. 7, the memory cell array 2240 of FIG. 4 may include a plurality of memory blocks BLK1 to BLKi. The first memory block BLK1, which is described by way of example, may include a plurality of strings ST11 to ST1m and ST21 to ST2m. In an embodiment, each of the strings ST11 to ST1m and ST21 to ST2m may be formed in a 'U' shape. In the first memory block BLK1, m strings may be arranged in a row direction (e.g., X direction). Although, in FIG. 7, two strings are illustrated as being arranged in a column direction (e.g., Y direction), this is for clarity and by way of example; three or more strings may be arranged in the column direction (e.g., Y direction) in other embodiments.

Each of the plurality of strings ST11 to ST1m and ST21 to ST2m may include at least one source select transistor SST, first to n-th memory cells MC1 to MCn, a pipe transistor PT, and at least one drain select transistor DST.

The source and drain select transistors SST and DST and the memory cells MC1 to MCn may have a similar structure. For example, each of the source and drain select transistors SST and DST and the memory cells MC1 to MCn may include a channel layer, a tunnel insulating layer, a charge trap layer, and a blocking insulating layer. For example, a pillar for providing the channel layer may be provided in each string. For example, a pillar for providing at least one of the channel layer, the tunnel insulating layer, the charge trap layer, and the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 7, the source select transistors of the strings ST11 to ST1m in a first row may be coupled to a first source select line SSL1. The source select transistors of the strings ST21 to ST2m in a second row may be coupled to a second source select line SSL2.

In other embodiments, the source select transistors of the strings ST11 to ST1m and ST21 to ST2m may be coupled in common to one source select line.

The first to n-th memory cells MC1 to MCn in each string may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp may be sequentially arranged in a vertical direction (e.g., Z direction), and may be coupled in series between the source select transistor SST and the pipe transistor PT. The p+1-th to n-th memory cells MCp+1 to MCn may be sequentially arranged in the vertical direction (e.g., Z direction), and may be coupled in series between the pipe transistor PT and the drain select transistor DST. The first to p-th memory cells MC1 to MCp and the p+1-th to n-th memory cells MCp+1 to MCn may be coupled to each other through the pipe transistor PT. Gates of the first to n-th memory cells MC1 to MCn in each string may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. A gate of the pipe transistor PT of each string may be coupled to a pipeline PL.

The drain select transistor DST of each string may be coupled between the corresponding bit line and the memory cells MCp+1 to MCn. Strings arranged in the row direction may be coupled to the corresponding drain select line extending in the row direction. The drain select transistors of the strings ST11 to ST1m in the first row may be coupled to a drain select line DSL1. The drain select transistors of the strings ST21 to ST2m in the second row may be coupled to a second drain select line DSL2.

The strings arranged in the column direction may be coupled to bit lines extending in the column direction. In FIG. 7, the strings ST11 and ST21 in a first column may be coupled to a first bit line BL1. The strings ST1m and ST2m in an m-th column may be coupled to an m-th bit line BLm.

Among strings arranged in the row direction, memory cells coupled to the same word line may constitute one page. For example, memory cells coupled to the first word line WL1, among the strings ST11 to ST1m in the first row, may constitute one page. Among the strings ST21 to ST2m in the second row, memory cells coupled to the first word line WL1 may constitute one additional page. Strings arranged in the direction of one row may be selected by selecting any one of the drain select lines DSL1 and DSL2. One page may be selected from the selected strings by selecting any one of the word lines WL1 to WLn.

Figure 8:
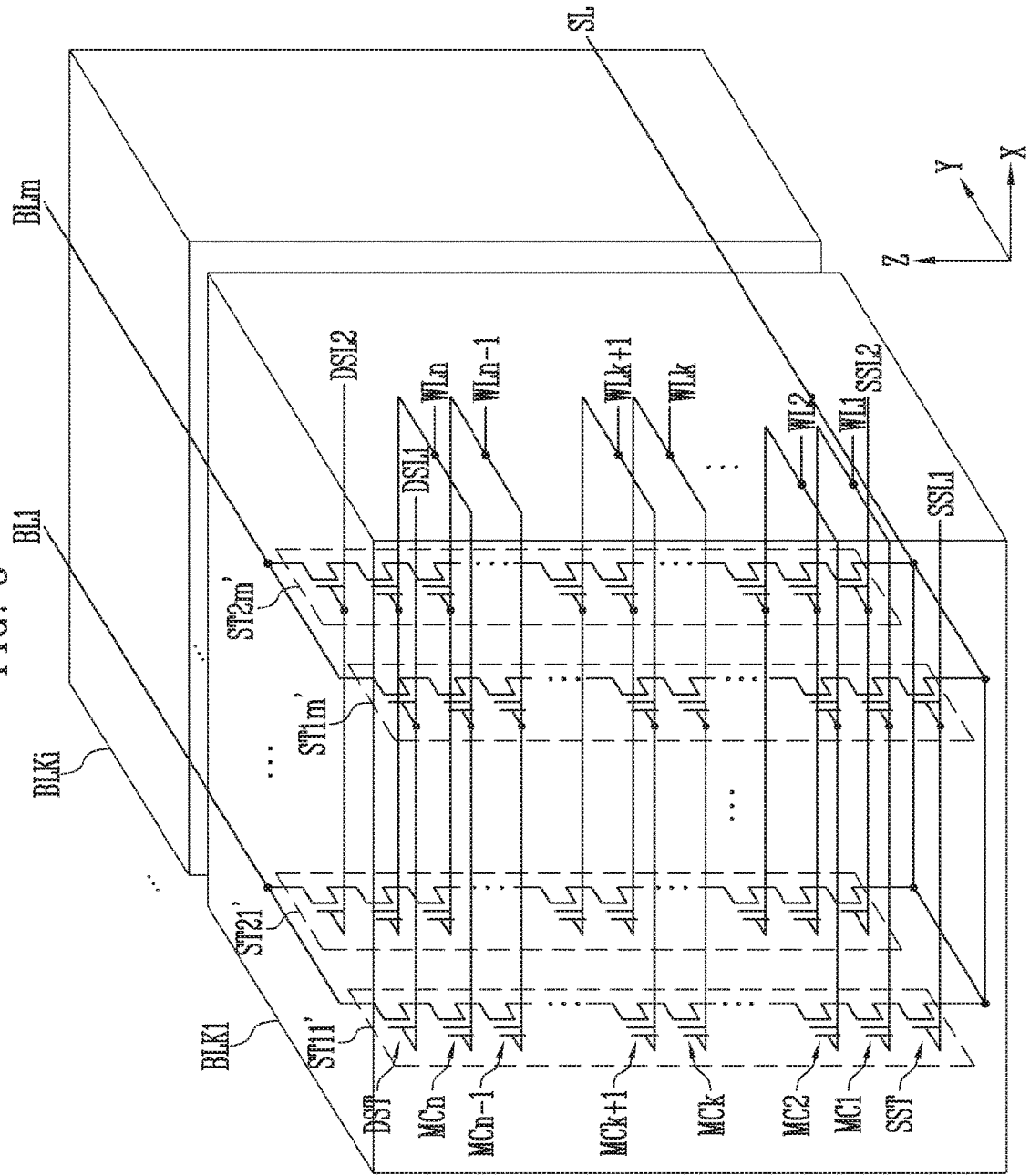
FIG. 8 is a diagram illustrating an example of a memory block having a three-dimensional (3D) structure.

FIG. 8 is a diagram illustrating an example of a memory block having a three-dimensional (3D) structure.

Referring to FIG. 8, a memory cell array 2240 of FIG. 4 may include a plurality of memory blocks BLK1 to BLKi. When the first memory block BLK1 is described by way of example, the first memory block BLK1 may include a plurality of strings ST11' to ST1m' and ST21' to ST2m'. Each of the strings ST11' to ST1m' and ST21' to ST2m' may extend along a vertical direction (e.g., Z direction). In the memory block BLKi, m strings may be arranged in a row direction (e.g., X direction). Although, in FIG. 8, two strings are illustrated as being arranged in a column direction (e.g., Y direction), this is for clarity and by way of example; three or more strings may be arranged in the column direction (e.g., Y direction) in other embodiments.

Each of the strings ST11' to ST1m' and ST21' to ST2m' may include at least one source select transistor SST, first to n-th memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. The source select transistors of the strings ST11' to ST1m' arranged in a first row may be coupled to a first source select line SSL1. The source select transistors of the strings ST21' to ST2m' arranged in a second row may be coupled to a second source select line SSL2. In an embodiment, the source select transistors of the strings ST11' to ST1m' and ST21' to ST2m' may be coupled in common to one source select line.

The first to n-th memory cells MC1 to MCn in each string may be coupled in series between the source select transistor SST and the drain select transistor DST. Gates of the first to n-th memory cells MC1 to MCn may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. Thereby, the reliability of data stored in the first memory block BLK1 may be improved.

The drain select transistor DST of each string may be coupled between the corresponding bit line and the memory cells MC1 to MCn. The drain select transistors DST of strings arranged in the row direction may be coupled to a drain select line extending along the row direction. The drain select transistors DST of the strings ST11' to ST1m' in the first row may be coupled to a first drain select line DSL1.

The drain select transistors DST of the strings ST21' to ST2m' in the second row may be coupled to a second drain select line DSL2.

That is, the first memory block BLK1 of FIG. 8 may have a circuit configuration similar to that of the first memory block BLK1 of FIG. 7 except that a pipe transistor PT is excluded from each string.

Figures 9, 10:
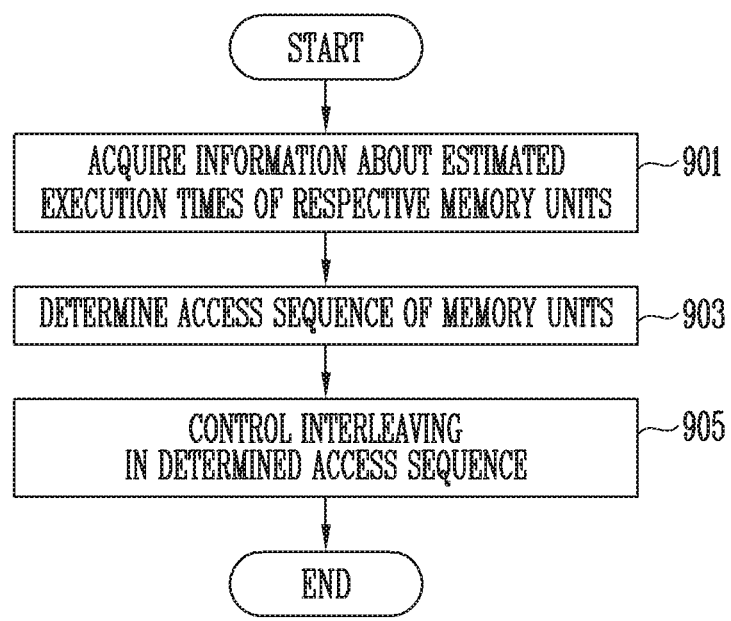
FIG. 9 is a flowchart illustrating a method of operating a memory controller in accordance with an embodiment of the present disclosure.
FIGS. 10 and 11 are diagrams illustrating a case where interleaving is controlled without considering estimated execution times.

FIG. 9 is a flowchart illustrating a method of operating a memory controller in accordance with an embodiment of the present disclosure.

An embodiment to be described with reference to FIG. 9 may be applied to the memory controller 2100 described above with reference to FIGS. 1 to 3.

Referring to FIG. 9, at step 901, the memory controller 2100 may acquire information about estimated execution times required by a plurality of memory units of the memory device 2200 to respectively perform an operation.

In an embodiment, the memory controller 2100 may receive information about the estimated execution times from the respective memory units. For example, each of the dies in the memory device 2200 stores information about an estimated execution time corresponding to that die, or stores information about estimated execution times corresponding to respective planes included in that die. The memory controller 2100 may request and receive information about the estimated execution time(s) from any of the dies. The memory controller 2100 may receive information about the estimated execution time(s) corresponding to the operation that is the target of interleaving. For example, each of the memory units stores information about estimated execution times respectively corresponding to a program operation, a read operation, and an erase operation. The memory controller 2100 may receive information about the estimated execution time corresponding to the operation that is the target of interleaving from each memory unit.

In an embodiment, the memory controller 2100 may calculate the estimated execution time of each of the memory units by performing a test operation on the corresponding memory unit. For example, the memory controller 2100 controls the memory units so that each of the memory units performs a test operation corresponding to any one of the program operation, the read operation, and the erase operation. The memory controller 2100 may calculate a test operation execution time, which is the time it takes for each of the memory units to perform the test operation. The memory controller 2100 may determine the calculated test operation execution time(s) to be the estimated execution time(s) of the corresponding memory unit.

At step 903, the memory controller 2100 may determine the access sequence of the memory units. In various embodiments, the memory controller 2100 determines the access sequence of the memory units based on the estimated execution times corresponding to respective memory units. For example, the memory controller 2100 determines the access sequence such that a memory unit having a longer estimated execution time has a higher or earlier sequential position (i.e., preceding turn) and a memory unit having a shorter estimated execution time has a lower or later sequential position (i.e., subsequent turn).

At step 905, the memory controller 2100 may control interleaving in the determined access sequence. That is, the memory controller 2100 may access the memory units in the determined access sequence to control interleaving.

Figure 11:
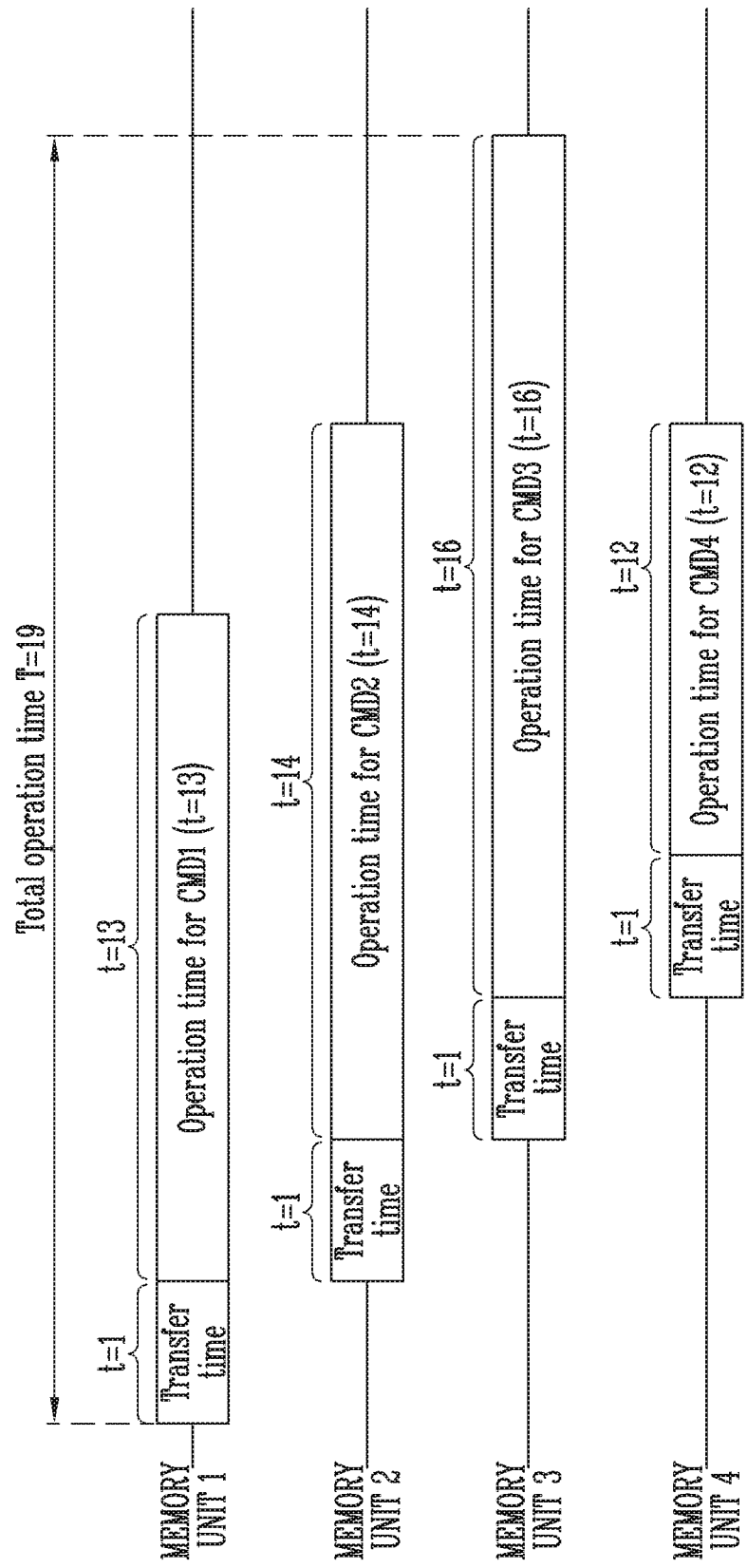

FIGS. 10 and 11 are diagrams illustrating a case where interleaving is controlled without considering estimated execution times.

In FIG. 10, estimated execution times corresponding to a plurality of memory units and the access sequence of the memory units are illustrated.

In the embodiment described with reference to FIG. 10, each estimated execution time is assumed to be an estimated execution time corresponding to any one of a program operation, a read operation, and an erase operation. Further, the memory units are assumed to be dies or planes.

Referring to FIG. 10, it can be seen that relative estimated execution times corresponding to respective memory units are different from each other. For example, an estimated execution time required by a memory unit 1 to perform an operation is 13, an estimated execution time required by a memory unit 2 to perform an operation is 14, an estimated execution time required by a memory unit 3 to perform an operation is 16, an estimated execution time required by a memory unit 4 to perform an operation is 12. A larger time number indicates a longer estimated execution time.

As illustrated in the drawing, the access sequence of memory units is determined regardless of the estimated execution times. That is, in the illustrated example, when the memory units are controlled in an interleaved manner, the memory unit 1 is accessed first, and thereafter the memory unit 2, the memory unit 3, and the memory unit 4 are sequentially accessed.

FIG. 11 illustrates respective operation times when the memory units are accessed in the access sequence illustrated in FIG. 10.

In the example depicted in FIG. 11 the time taken for each memory unit to actually perform an operation is equal to the estimated execution time corresponding to the memory unit. Also, a transfer time, which is the time taken to command each memory unit to perform an operation is assumed to be '1'. The transfer time may be the time taken to transfer a command and an address or the time taken to transfer a command, an address, and data.

Referring to FIG. 11, it can be seen that the operation of the memory unit 3, among the four memory units which perform operations in an interleaved manner, is completed last. Also, it can be seen that the total operation time of the memory units 1 to 4, that is, a time period from the time at which a command starts to be transferred to the memory unit 1 to the time at which the operation of the memory unit 3 completes its operation, is 19.

Figure 13:
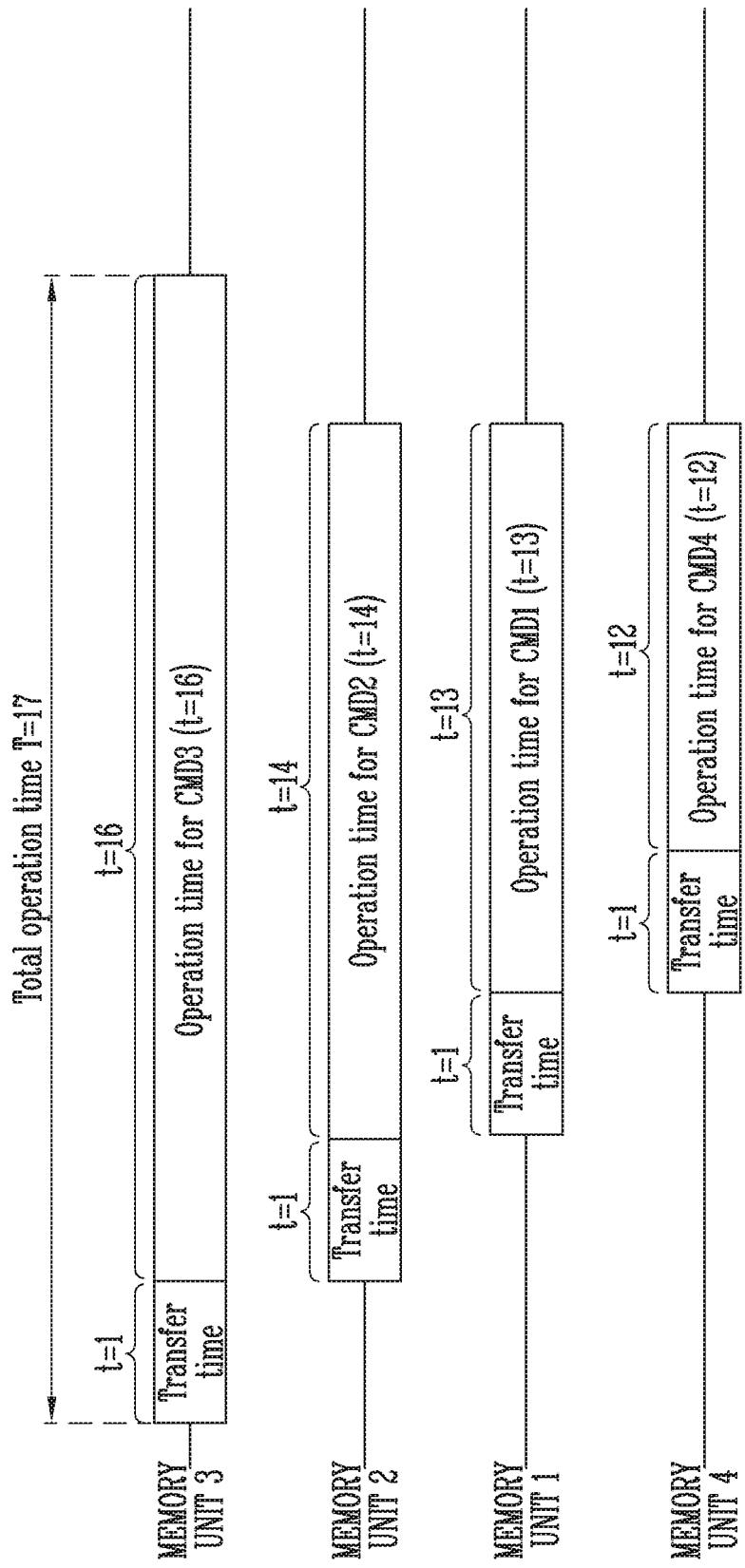

FIGS. 12 and 13 are diagrams illustrating a case where interleaving is controlled in consideration of estimated execution times.

Similar to the embodiment of FIG. 10, FIG. 12 illustrates estimated execution times corresponding to a plurality of memory units and the access sequence of the memory units.

However, unlike the embodiment of FIG. 10, FIG. 12 illustrates an embodiment in which the access sequence of the plurality of memory units is determined based on estimated execution times corresponding to the memory units. That is, when interleaving is controlled in the access sequence illustrated in FIG. 12, the memory unit 3 may be accessed first, and thereafter the memory unit 2, the memory unit 1, and the memory unit 4 may be sequentially accessed.

FIG. 13 illustrates respective operation times when the memory units are accessed in the access sequence illustrated in FIG. 12.

Similar to the embodiment described with reference to FIG. 11, in an embodiment of FIG. 13 the time taken for each memory unit to actually perform an operation is equal to the estimated execution time corresponding to the memory unit. Also, a transfer time, which is the time taken to command each memory unit to perform an operation, is assumed to be 1. The transfer time may be the time taken to transfer a command and an address or the time taken to transfer a command, an address, and data.

Referring to FIG. 13, the operation of the memory unit 3 is performed first. Then, the operation of the memory unit 2 is performed. Next, the operation of the memory unit 1 is performed. Finally, the operation of the memory unit 4 is performed. In other words, it can be seen that the operation of the memory unit 3, among the memory units 1 to 4 which perform operations in an interleaved manner, is completed last. Also, it can be seen that the total operation time of the memory units, that is, a time period from the time at which a command starts to be transferred to the memory unit 3 to the time at which the operation of the memory unit 3 is completed, is 17. Specifically, a time period from the time at which a command starts to be transferred to the memory unit 3 to the time at which the operation of the memory unit 3 is completed is 17. A time period from the time at which a command starts to be transferred to the memory unit 2 to the time at which the operation of the memory unit 2 is completed is 15. A time period from the time at which a command starts to be transferred to the memory unit 1 to the time at which the operation of the memory unit 1 is completed is 14. A time period from the time at which a command starts to be transferred to the memory unit 4 to the time at which the operation of the memory unit 4 is completed is 13.

Compared to the case described above with reference to FIG. 11, in FIG. 13 it can be seen that the total operation time of the memory units may be shortened when the access sequence of the memory units is determined based on the estimated execution times corresponding to respective memory units. That is, in the embodiment of FIG. 13, the access sequence of the memory units is set such that the memory units are accessed in an order that minimizes the total operation time.

Figure 14:
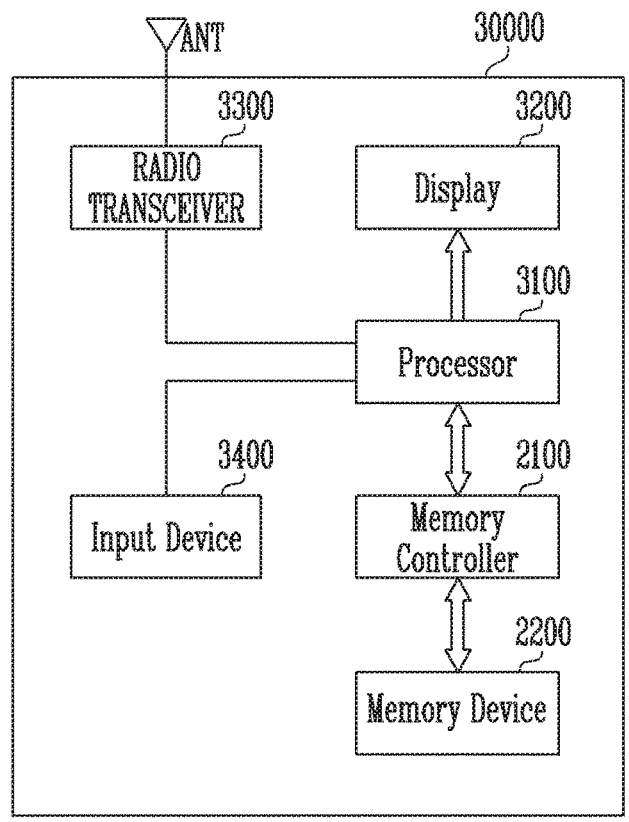
FIGS. 14 to 17 are diagrams illustrating a memory system including a memory controller in accordance with embodiments of the present disclosure.

FIG. 14 is a diagram illustrating a memory system 30000 including a memory controller in accordance with an embodiment of the present disclosure, for example, the memory controller 2100 of FIGS. 1 to 3.

Referring to FIG. 14, the memory system 30000 may be implemented as a cellular phone, a smartphone, a tablet personal computer (PC), a PC, a personal digital assistant (PDA) or a wireless communication device. The memory system 30000 may include a memory device 2200 and the memory controller 2100 that is capable of controlling the operation of the memory device 2200. The memory device 2200 illustrated in FIG. 14 may correspond to the memory device 2200 illustrated in FIGS. 1 to 3. The memory controller 2100 illustrated in FIG. 14 may correspond to the memory controller 2100 illustrated in FIGS. 1 to 3.

The memory controller 2100 may control a data access operation, e.g., a program, erase, or read operation, of the memory device 2200 under the control of a processor 3100.

Data programmed in the memory device 2200 may be outputted via a display 3200 under the control of the memory controller 2100.

A radio transceiver 3300 may transmit and receive radio signals through an antenna ANT. For example, the radio transceiver 3300 may convert a radio signal received through the antenna ANT into a signal which may be processed by the processor 3100. Therefore, the processor 3100 may process a signal outputted from the radio transceiver 3300 and transmit the processed signal to the memory controller 2100 or the display 3200. The memory controller 2100 may transmit a signal processed by the processor 3100 to the memory device 2200. Furthermore, the radio transceiver 3300 may convert a signal outputted from the processor 3100 into a radio signal, and output the converted radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data outputted from the memory controller 2100, data outputted from the radio transceiver 3300, or data outputted from the input device 3400 is outputted via the display 3200.

In an embodiment, the memory controller 2100 capable of controlling the operation of the memory device 2200 may be implemented as a part of the processor 3100 or as a chip provided separately from the processor 3100.

Figure 15:
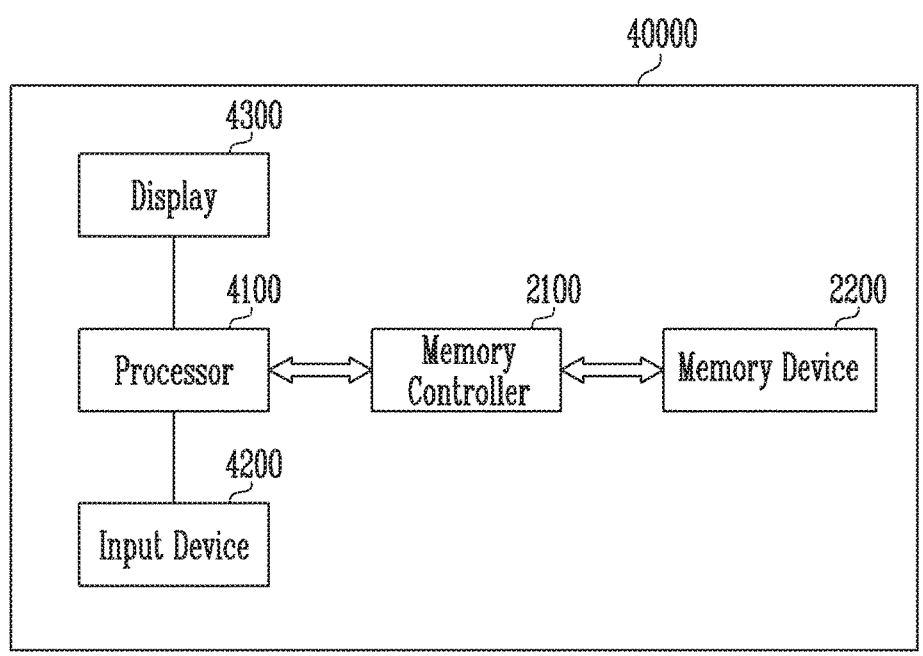

FIG. 15 is a diagram illustrating a memory system 40000 including a memory controller in accordance with an embodiment of the present disclosure, for example, the memory controller 2100 of FIGS. 1 to 3.

Referring to FIG. 15, the memory system 40000 may be embodied in a personal computer, a tablet PC, a PC, a net-book, an e-reader, a personal digital assistant (PDA), a portable multimedia player (PMP), an MP3 player, or an MP4 player.

The memory system 40000 may include a memory device 2200 and the memory controller 2100 that is capable of controlling a data processing operation of the memory device 2200. The memory device 2200 illustrated in FIG. 15 may correspond to the memory device 2200 illustrated in FIGS. 1 to 3. The memory controller 2100 illustrated in FIG. 15 may correspond to the memory controller 2100 illustrated in FIGS. 1 to 3.

A processor 4100 may output data stored in the memory device 2200 via a display 4300, according to data inputted from an input device 4200. For example, the input device 4200 may be implemented as a point device such as a touch pad or a computer mouse, a keypad or a keyboard.

The processor 4100 may control the overall operation of the memory system 40000 and control the operation of the memory controller 2100. In an embodiment, the memory controller 2100 capable of controlling the operation of the memory device 2200 may be implemented as a part of the processor 4100 or as a chip provided separately from the processor 4100.

Figure 16:
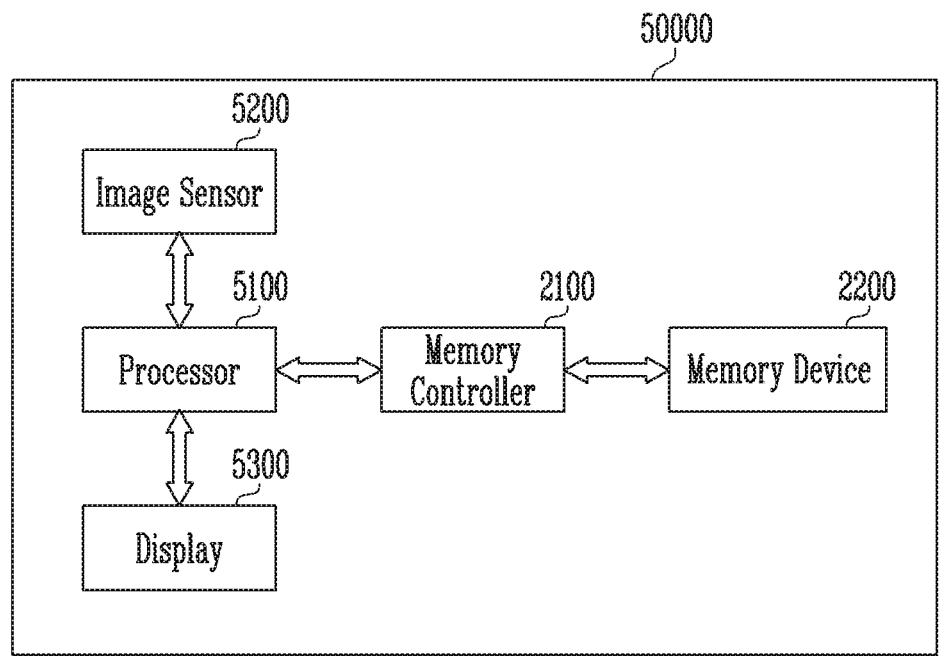

FIG. 16 is a diagram illustrating a memory system 50000 including a memory controller in accordance with an embodiment of the present disclosure, for example, the memory controller 2100 of FIGS. 1 to 3.

Referring to FIG. 16, the memory system 50000 may be embodied in an image processing device, e.g., a digital camera, a portable phone provided with a digital camera, a smartphone provided with a digital camera, or a tablet personal computer (PC) provided with a digital camera.

The memory system 50000 may include a memory device 2200 and the memory controller 2100 that is capable of controlling a data processing operation, e.g., a program, erase, or read operation, of the memory device 2200. The memory device 2200 illustrated in FIG. 16 may correspond to the memory device 2200 illustrated in FIGS. 1 to 3. The memory controller 2100 illustrated in FIG. 16 may correspond to the memory controller 2100 illustrated in FIGS. 1 to 3.

An image sensor 5200 of the memory system 50000 may convert an optical image into digital signals. The converted digital signals may be transmitted to a processor 5100 or the memory controller 2100. Under the control of the processor 5100, the converted digital signals may be outputted via a display 5300 or stored in the memory device 2200 through the memory controller 2100. Data stored in the memory device 2200 may be outputted via the display 5300 under the control of the processor 5100 or the memory controller 2100.

In an embodiment, the memory controller 2100 capable of controlling the operation of the memory device 2200 may be implemented as a part of the processor 5100, or as a chip provided separately from the processor 5100.

Figure 17:
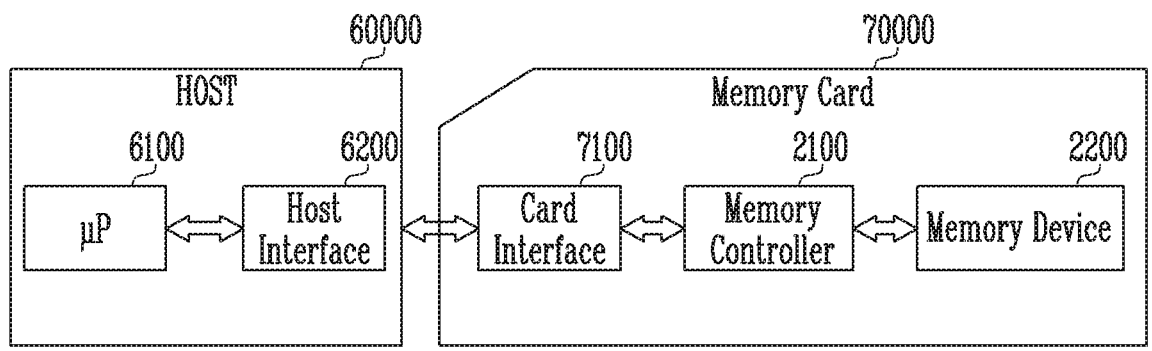

FIG. 17 is a diagram illustrating a memory system 70000 including a memory controller in accordance with an embodiment of the present disclosure, for example, the memory controller 2100 of FIGS. 1 to 3.

Referring to FIG. 17, the memory system 70000 may be embodied in a memory card or a smart card. The memory system 70000 may include a memory controller 2100, a memory device 2200, and a card interface 7100. The memory device 2200 illustrated in FIG. 17 may correspond to the memory device 2200 illustrated in FIGS. 1 to 3. The memory controller 2100 illustrated in FIG. 17 may correspond to the memory controller 2100 illustrated in FIGS. 1 to 3.

The memory controller 2100 may control data exchange between the memory device 2200 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 2100 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory system 70000 is connected to a host interface 6200 of the host 60000 such as a personal computer (PC), a tablet PC, a digital camera, a digital audio player, a cellular phone, console video game hardware or a digital set-top box, the host interface 6200 may perform data communication with the memory device 2200 through the card interface 7100 and the memory controller 2100 under the control of a microprocessor (µP) 6100.

In accordance with embodiments of the present disclosure, the access sequence of memory units may be determined based on estimated operation execution times of respective memory units, so that the entire execution time of operations performed in an interleaved manner may be shortened, and thus the speed of a memory system may be improved.

While the various embodiments of the present disclosure have been disclosed, those skilled in the art will appreciate, in light of the present disclosure, that various modifications, additions and substitutions are possible. Therefore, the scope of the present disclosure is defined by the appended claims and equivalents thereof rather than by the description preceding them.

What is claimed is:
1. A memory controller, comprising:
an interleaving component configured to determine an access sequence of a plurality of memory units based on estimated execution times for the respective memory units to perform an operation; and a processor configured to access the memory units in the determined access sequence to perform the operation in an interleaved manner.

2. The memory controller according to claim 1, wherein the interleaving component is configured to determine the access sequence of the plurality of memory units in an order of longest to shortest estimated execution times.

3. The memory controller according to claim 1, wherein:
the processor controls the memory units such that each of the memory units performs a test operation corresponding to any one of a program operation, a read operation, and an erase operation, and calculates a test operation execution time, which is the time taken for the corresponding memory unit to perform the test operation, and
the interleaving component determines the calculated test operation execution time of the corresponding memory unit to be its estimated execution time.

4. The memory controller according to claim 1, wherein the memory units include dies or planes included in each of the dies.

5. The memory controller according to claim 4, wherein the interleaving component is configured to receive information about the estimated execution times from the dies.

6. The memory controller according to claim 1, wherein the operation includes a program operation, a read operation or an erase operation.

7. A memory system, comprising:
a plurality of memory units configured to perform an operation in an interleaved manner; and
a memory controller configured to determine an access sequence of the memory units based on estimated execution times for the respective memory units to perform the operation and to access the memory units in the determined access sequence.

8. The memory system according to claim 7, wherein the memory controller is configured to determine the access sequence of the plurality of memory units in an order of longest to shortest estimated execution times.

9. The memory system according to claim 7, wherein the memory controller is configured to control the memory units such that each of the memory units performs a test operation corresponding to any one of a program operation, a read operation, and an erase operation, calculate a test operation execution time, which is the time taken for the corresponding memory unit to perform the test operation, and determine the calculated test operation execution time of the corresponding memory unit to be its estimated execution time.

10. The memory system according to claim 7, wherein the memory units include dies or planes included in each of the dies.

11. The memory system according to claim 10, wherein:
each of the dies stores information about the estimated execution time for the corresponding die, and
the memory controller receives information about the estimated execution times from the dies.

12. The memory system according to claim 7, wherein the operation includes a program operation, a read operation or an erase operation.

13. A method of operating a memory controller, the method comprising:
acquiring, by the controller, information about estimated execution times for a plurality of memory units to respectively perform an operation;
determining, by the controller, an access sequence of the memory units based on the estimated execution times; and
accessing, by the controller, the memory units in the determined access sequence to perform the operation in an interleaved manner.

14. The method according to claim 13, wherein determining the access sequence comprises determining the access sequence of the plurality of memory units in an order of longest to shortest estimated execution times.

15. The method according to claim 13, wherein acquiring the information about the estimated execution times comprises:
controlling the memory units such that each of the memory units performs a test operation corresponding to any one of a program operation, a read operation, and an erase operation; and
determining a time taken for each of the memory units to perform the test operation to be the estimated execution time of the corresponding memory unit.

16. The method according to claim 13, wherein the memory units include dies or planes included in each of the dies.

17. The method according to claim 16, wherein acquiring the information about the estimated execution times comprises receiving information about the estimated execution times from the dies.

18. The method according to claim 13, wherein the operation includes a program operation, a read operation or an erase operation.

19. A memory system, comprising:
a plurality of memory units configured to function as an interleaving group in an initial access sequence to perform an operation; and
a memory controller including:
an interleaving component configured to reorder the access sequence of the memory units based on estimated execution times for the respective memory units to perform the operation; and
a processor access the memory units in the reordered access sequence.

20. The memory system of claim 19, wherein the estimated execution times are determined by the memory controller.

* * * * *